(12) United States Patent
Rührig

(10) Patent No.: US 6,646,530 B2
(45) Date of Patent: Nov. 11, 2003

(54) CONFIGURATION FOR MINIMIZING THE NEEL INTERACTION BETWEEN TWO FERROMAGNETIC LAYERS ON BOTH SIDES OF A NON-FERROMAGNETIC SEPARATING LAYER

(75) Inventor: Manfred Rührig, Eckental (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/284,775

(22) Filed: Oct. 31, 2002

(65) Prior Publication Data

US 2003/0117247 A1 Jun. 26, 2003

(30) Foreign Application Priority Data

Oct. 31, 2001 (DE) .......................................... 101 53 658

(51) Int. Cl.$^7$ ............................................... G11C 11/15

(52) U.S. Cl. ...................... 335/306; 365/158; 365/171; 365/173

(58) Field of Search .......................... 335/306; 365/157, 365/158, 171, 173

(56) References Cited

U.S. PATENT DOCUMENTS 6,252,796 B1 * 6/2001 Lenssen et al. .............. 365/173
6,542,341 B1 * 4/2003 Carey et al. ................. 360/324

* cited by examiner

Primary Examiner—Ramon M. Barrera
(74) Attorney, Agent, or Firm—Laurence A. Greenberg; Werner H. Stemer; Ralph E. Locher

(57) ABSTRACT

A configuration for minimizing and compensating for the Néel interaction between a first ferromagnetic layer and a second ferromagnetic layer on both sides of a nonmagnetic separating layer has an artificial anti-ferromagnetic layer system. The two ferromagnetic layers each being sublayers of an artificial anti-ferromagnetic layer system contribute to the minimization of the Néel interaction.

5 Claims, 5 Drawing Sheets

CONFIGURATION FOR MINIMIZING THE NEEL INTERACTION BETWEEN TWO FERROMAGNETIC LAYERS ON BOTH SIDES OF A NON-FERROMAGNETIC SEPARATING LAYER

BACKGROUND OF THE INVENTION

Field of the Invention

The invention relates to a configuration for minimizing the Néel interaction between a first and a second ferromagnetic layer on both sides of a nonmagnetic separating layer, the first ferromagnetic layer being a sublayer of an artificial antiferromagnetic layer system. In addition, the invention relates to a configuration for compensating for a minimized Néel interaction in the second ferromagnetic layer.

The Néel interaction acts between two magnetized ferromagnetic layers on both sides of a thin, non-magnetic separating layer. It is caused by the roughness of the surfaces—respectively facing the separating layer—of the two ferromagnetic layers.

SUMMARY OF THE INVENTION

It is accordingly an object of the invention to provide a configuration for minimizing the Néel interaction between two ferromagnetic layers on both sides of a non-ferromagnetic separating layer, that overcomes the disadvantages of the prior art devices of this general type, in which the Néel interaction between the first ferromagnetic layer and the second ferromagnetic layer lying opposite the latter at the separating layer is minimized in terms of magnitude and, at the same time, the remaining Néel interaction is compensated for.

With the foregoing and other objects in view there is provided, in accordance with the invention, a configuration for minimizing a Néel interaction. The configuration contains a first asymmetrical artificial anti-ferromagnetic layer system having a first ferromagnetic sublayer, a second ferromagnetic sublayer, and a first spacer layer disposed between the first and second ferromagnetic sublayers. A separating layer is provided. The first ferromagnetic sublayer is oriented toward the separating layer and has a smaller layer thickness than the second ferromagnetic sublayer of the first asymmetrical artificial anti-ferromagnetic layer system. A second asymmetrical artificial antiferromagnetic layer system has a first ferromagnetic sublayer oriented toward the separating layer, a second ferromagnetic sublayer, and a second spacer layer disposed between the first and second ferromagnetic sublayers of the second asymmetrical artificial anti-ferrromagnetic layer system. The first ferromagnetic sublayer of the second asymmetrical artificial anti-ferromagnetic layer system has a smaller layer thickness than the second ferromagnetic sublayer of the second asymmetrical artificial anti-ferromagnetic layer system. Resulting total magnetizations of the first and second asymmetrical artificial anti-ferromagnetic layer systems are accumulated vectorially in a manner that compensates for the Néel interaction between the first ferromagnetic sublayer of the first asymmetrical artificial anti-ferromagnetic layer system and the first ferromagnetic sublayer of the second asymmetrical artificial anti-ferromagnetic layer system each being oriented toward the separating layer.

Thus, in the configuration according to the invention, a second ferromagnetic layer of a magnetoresistive memory cell with an inverse artificial antiferromagnet (AAF) reference layer system is provided as the first sublayer of a second inverse asymmetrical AAF layer system ("inverse AAF memory layer system"). Such a second AAF layer system has two ferromagnetic sublayers on both sides of a second spacer layer (spacer). The first ferromagnetic sublayer, oriented toward the separating layer, of the second AAF layer system has a smaller layer thickness than the second sublayer, remote from the separating layer, of the second AAF layer system. The second AAF layer system then has in each case a net moment directed opposite to the magnetization of the first ferromagnetic sublayer, oriented toward the separating layer, of the second AAF layer system. In the case of a simplified magnetostatic consideration, the net moments of the two AAF layer systems counteract a parallel orientation of the magnetizations of the two first ferromagnetic sublayers each oriented toward the separating layer, while the remaining Néel interaction furthermore prefers a parallel orientation of the two magnetizations. The switching behavior of a magnetoresistive memory cell based on such a configuration can be symmetrized through suitable dimensioning of the AAF layer systems, the magnitude of the Néel interaction being reduced relative to conventional configurations.

The first AAF layer system (AAF reference layer system) can be coupled to a natural anti-ferromagnet in order to stabilize the magnetization. Through the coupling of the first AAF layer system to a layer made of a natural anti-ferromagnet, the magnetic stability of the AAF reference layer system is increased by a mechanism described as "exchange biasing".

In accordance with an added feature of the invention, the first symmetrical artificial anti-ferromagnetic layer system is a reference layer system and the second asymmetrical artificial anti-ferromagnetic layer system is a memory layer system of a magneto-resistive memory cell. The magnetoresistive memory cell is based on a tunnel effect and the separating layer is composed of a dielectric material and functions as a tunnel barrier.

In accordance with another feature of the invention, at least one exchange bias layer is disposed at a surface of the reference layer system lying remote from the tunnel barrier and a magnetization of the exchange bias layer is fixedly coupled to a magnetization of the reference layer system. The exchange bias layer extends beyond dimensions of the reference layer system in a plane parallel to the tunnel barrier.

Other features which are considered as characteristic for the invention are set forth in the appended claims.

Although the invention is illustrated and described herein as embodied in a configuration for minimizing the Néel interaction between two ferromagnetic layers on both sides of a non-ferromagnetic separating layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2A:
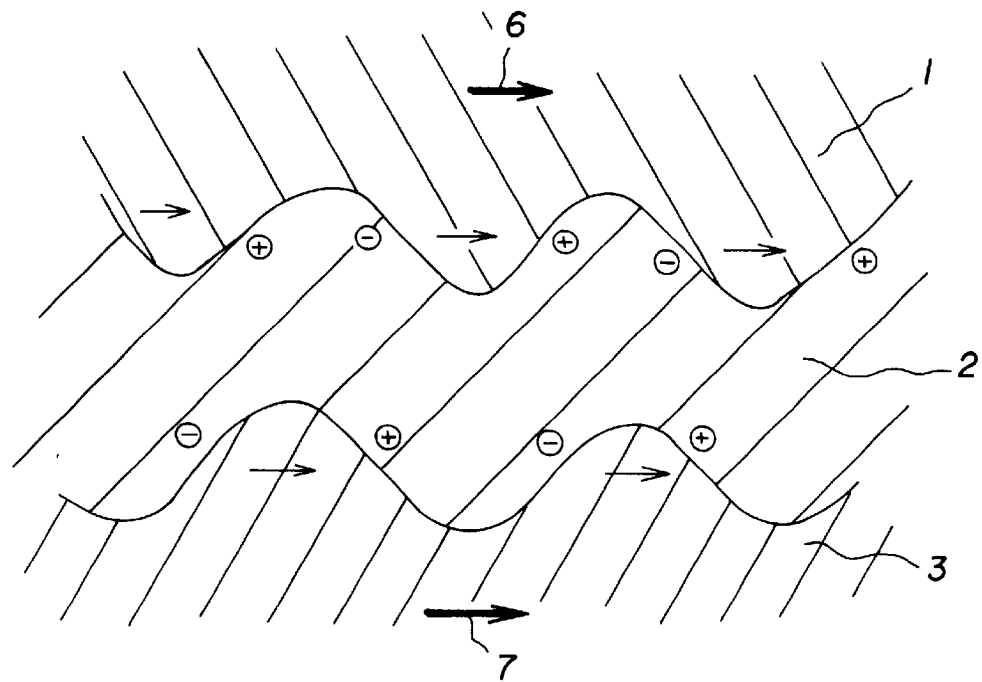
FIGS. 2A and 2B are diagrammatic, partial sectional views for illustrating a Néel interaction using a section through a separating layer and adjoining layers.
Figure 2B:
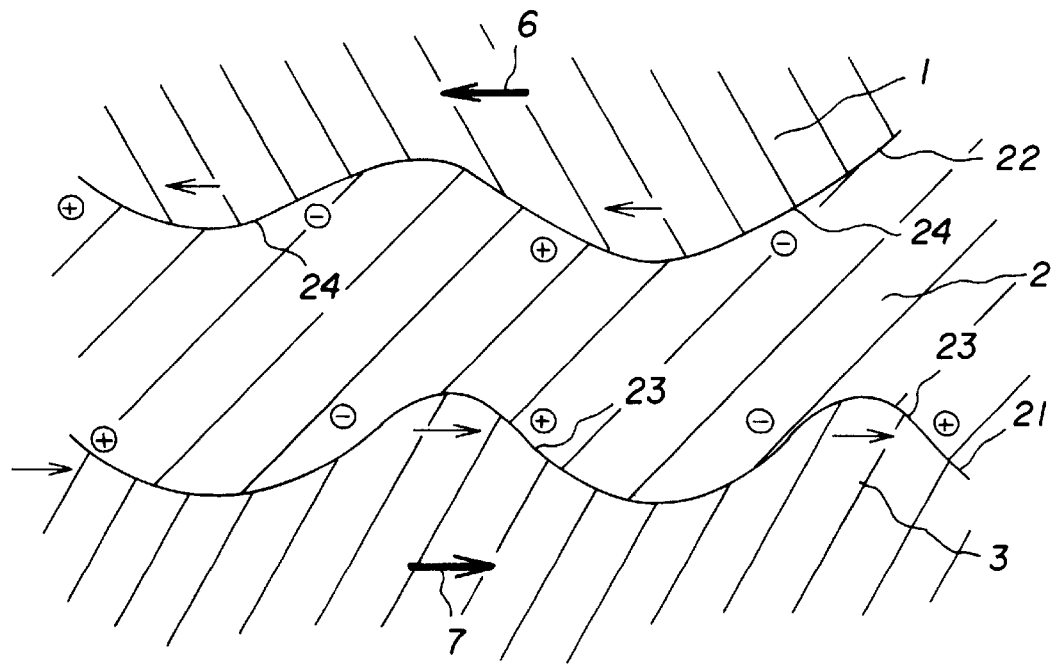

Referring now to the figures of the drawing in detail and first, particularly, to FIGS. 2A and 2B thereof, there is shown the mechanism of a Néel interaction illustrated in a simplified magnetostatic consideration.

FIG. 2B shows a surface 21 of a first ferromagnetic layer 3 with a magnetization 7 which has, on account of its roughness, bulges 23 of a first type at which proportions of the magnetization 7 enter or exit. Equally, a surface 22 of a second ferromagnetic layer 1, which surface lies opposite the surface 21 at a non-ferromagnetic separating layer 2, has bulges 24 of a second type at which proportions of a magnetization 6 of the second ferromagnetic sublayer 1 enter or exit.

The bulges 23, 24 of the two ferromagnetic layers 3, 1 lie opposite one another in offset fashion.

In the case of unidirectional magnetizations 6, 7 of the two ferromagnetic layers 1, 3, as illustrated in FIG. 2A, the entry locations of the magnetization 7 of the first layer 3 and the-exit locations of the magnetization 6 on the surface 23 of the second layer 1 lie approximately opposite one another. Thus, polarities of opposite senses lie opposite one another in the case of a magnetostatic consideration at the separating layer 2, which polarities by virtue of the magnetic interaction, support the parallel orientation of the two magnetizations 6, 7 of the two ferromagnetic layers 1, 3.

In the case of mutually oppositely directed magnetizations 6, 7 of the two ferromagnetic layers 1, 3, by contrast, as shown in FIG. 2B, polarities of the same sense lie opposite each other on the mutually facing surfaces 21, 22 of the two ferromagnetic layers 1, 3. In this case, the Néel interaction counteracts the opposite orientation of the magnetization 6, 7 of the two ferromagnetic layers 1, 3.

Thus, the Néel interaction always supports a unidirectional (parallel hereinafter) orientation of the magnetization of the two ferromagnetic layers and counter-acts an oppositely directed (anti-parallel hereinafter) orientation of the magnetization of the two ferromagnetic layers 1, 3.

In this respect, reference is made to L. Néel, Comptes Rendus Acad. Sci. 255, 1676 (1962).

The Néel interaction acquires increasing importance with decreasing layer thicknesses and is relevant to the technical realization of magnetic sensors and magnetoresistive memory cells.

In the simplest case, a magnetoresistive memory cell contains a stack of at least two ferromagnetic layers with a non-ferromagnetic separating layer lying in between. Typically, the first ferromagnetic layer is in this case made of a hard-magnetic material, for instance a cobalt-iron alloy. The ferromagnetic layer functions as a reference layer with a magnetization that is constant in terms of magnitude and direction.

The second ferromagnetic layer made of a soft-magnetic material, typically a nickel-iron alloy, forms a memory layer. The magnetization of the memory layer is oriented unidirectionally or in oppositely directed fashion with respect to the magnetization of the reference layer, corresponding to a data content of the memory cell.

If the magnetoresistive memory cell is based on the tunnel effect, then the material of the separating layer is a dielectric. The frequency of a transition of electrons from one ferromagnetic layer to the other is higher in the case of unidirectional magnetization of the two ferromagnetic layers than in the case of oppositely directed magnetization of the two layers. From the conductivity of the layer system, it is possible to deduce the orientation of the magnetization of the memory layer relative to the magnetization of the reference layer and thus the data content of the memory cell.

In present-day concepts for magnetoresistive memory cells the reference layer is fashioned as a first sublayer of a reference layer system. One example of such a reference layer system is an artificial anti-ferromagnetic layer system (hereinafter artificial anti-ferromagnet (AAF) layer system). The AAF layer system contains two ferromagnetic sublayers on both sides of a very thin conductive spacer layer (spacer), typically having a thickness of a few atomic layers. In this case, the magnetizations of the two ferromagnetic layers are preferably directed oppositely to one another. The magnetizations of the two ferromagnetic sublayers are fixedly coupled to one another by Rudermann-Kittel-Kasuya-Yosida interaction and have an improved stability behavior relative to simple hard-magnetic layers.

AAF layer systems are widespread in ferromagnetic sensors and as part of spin valves in GMR (giant magnetoresistive) systems.

Figure 3A:
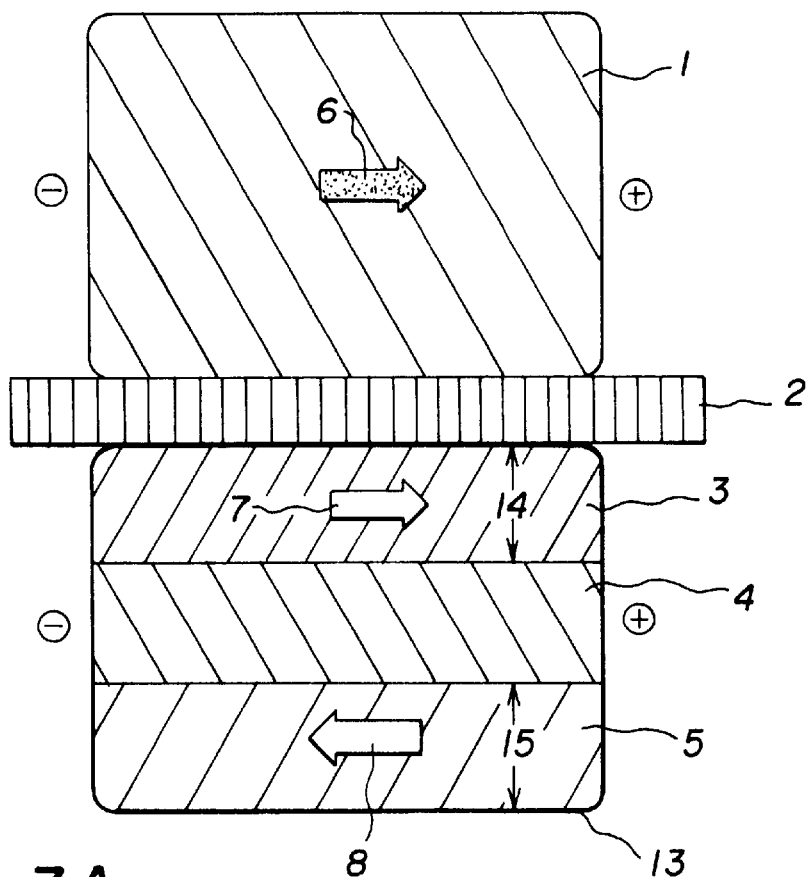
FIG. 3A is a diagrammatic, cross-sectional view through a magnetoresistive memory cell with a symmetrical AAF reference layer system according to the prior art.

The construction illustrated in a simplified manner in a diagrammatic cross section in FIG. 3A results for a magnetoresistive memory cell with an AAF reference layer system.

The memory layer 1 with the magnetization 6 and an AAF reference layer system 13 are disposed such that they lie opposite one another at a tunnel barrier 2. In the AAF reference layer system 13, two ferromagnetic sublayers 3, 5 having in each case oppositely directed magnetizations 7, 8 are disposed on both sides of a spacer 4. The first ferromagnetic sublayer 3—facing the tunnel barrier 2—of the AAF reference layer system forms a reference layer 3. The second sublayer 5 remote from the tunnel barrier 2 forms a reference coupling layer 5.

In this example, the two ferromagnetic sublayers 3, 5 of the AAF reference layer system 13 are composed of the same material and have approximately identical layer thicknesses 14, 15, and also identical magnetizations 7, 8 in terms of the magnitude. The two oppositely directed magnetizations 7, 8 of the two ferromagnetic sublayers 3, 5 of the AAF reference layer system 13 then approximately compensate for one another toward the outside.

For the following consideration, the magnetization 7 of the reference layer 3 is assumed to be unidirectional with the magnetization 6 of the memory layer 1. The remaining ferromagnetic coupling between the reference layer 3 and the memory layer 1 is dominated by the Néel interaction, which supports a parallel orientation of the magnetization 6, 7 of the two layers 1, 3.

Figure 3B:
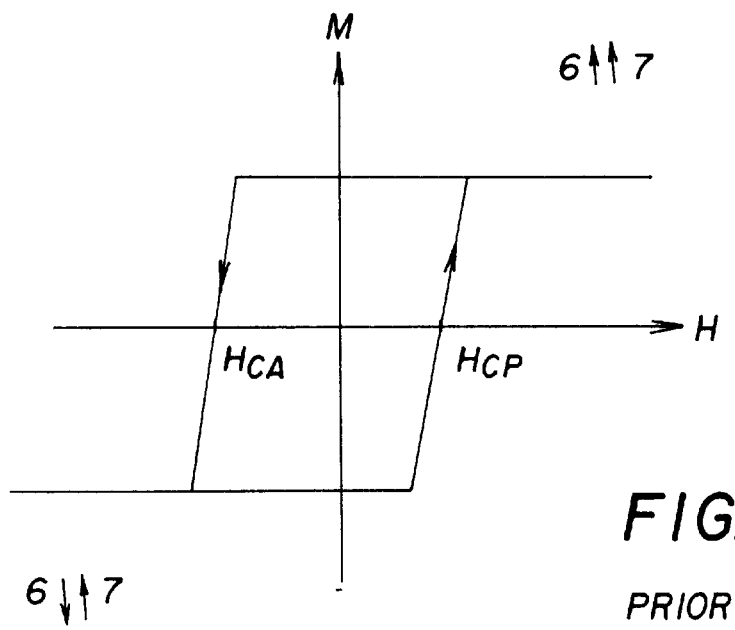
FIG. 3B is a simplified illustration of a magnetization curve of a memory layer of the magnetoresistive memory cell.

The magnetization curve of the memory layer 1 for the configuration depicted in FIG. 3A is illustrated in a simplified manner in FIG. 3B. In this case, the magnetization 6 of the memory layer 1 that is parallel to the magnetization 7 of the reference layer 3 is defined positively. Since the Néel interaction supports a parallel orientation of the magnetizations 6, 7 of the two layers, a transition from an anti-parallel state of the two magnetizations to a parallel state requires a magnetic field strength $H_{CP}$ whose magnitude is smaller than that of a magnetic field strength $H_{CA}$ that is necessary for the reverse operation. In this system of coordinates, the magnetization curve of the memory layer 1 appears shifted toward the left by the Néel interaction.

A magnetization curve that is symmetrical with respect to the coordinate axis would be technically desirably. The strength of the magnetic field H is proportional to a magnitude of a write current I that generates a magnetic field H and has to be made available during operation of the magnetoresistive memory cell. Accordingly, the magnetic field strength $H_{CP}$ corresponds to a write current $I_P$ which is necessary in order to orient the magnetizations 6, 7 of the two ferromagnetic layers on both sides of the tunnel barrier 2 in parallel fashion. A write current $I_A$ corresponds to the magnetic field strength $H_{CA}$, which write current is necessary in order that the magnetization 6 of the memory layer 1 is directed oppositely to the magnetization 7 of the ferromagnetic layer 3.

It is endeavored to make the magnitude of the write current $I_A$ equal to that of the write current $I_P$. If, as in the present example, $I_P$ and $H_{CP}$ are less than $I_A$ and $H_{CH}$, even relatively small magnetic fields could compel a changeover of the magnetization 6 of the memory layer 1 into a state parallel to the magnetization 7 of the reference layer 3. This would reduce a reserve with respect to an undesirable changeover of the magnetization. Such undesirable magnetic fields may be caused first by extreme interference fields with a source outside a component having magnetoresistive memory cells. A second source of such magnetic fields are, for instance, magnetic fields generated by write currents of adjacent memory cells within the component.

On the other hand, the magnitude of the current intensity $I_A$ necessary for changeover into the anti-parallel state increases, so that an increased write current must be provided for this case. An increased write current is combined with an undesirable-higher electrical power consumption and a higher thermal power loss.

Figure 4A:
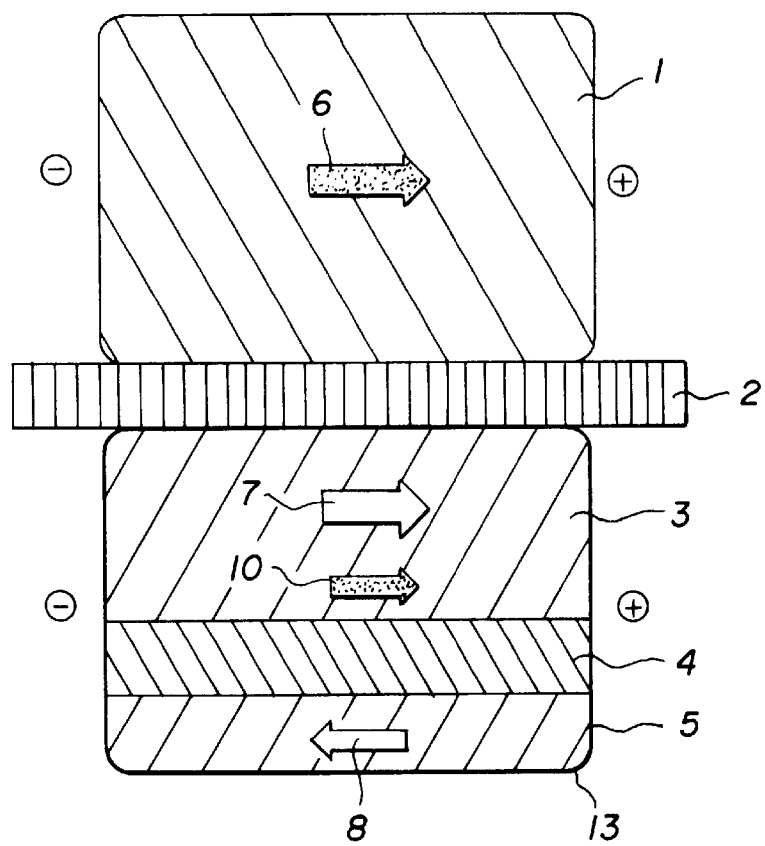
FIG. 4A is a diagrammatic, cross-sectional view through a magnetoresistive memory cell with a symmetrical AAF reference layer system of conventional type according to the prior art.

It is possible have a symmetrical magnetization curve of the memory layer and thus also the switching behavior of the magnetoresistive memory cell by a construction as illustrated diagrammatically in FIG. 4A.

In this construction, the first ferromagnetic sublayer 3, oriented toward the tunnel barrier 2, of an AFF reference layer system 13 has an increased layer thickness relative to a second ferromagnetic sublayer 5 (asymmetrical artificial antiferromagnet). The magnetizations 7, 8 of the ferromagnetic sublayers 3, 5 do not compensate for one another. Rather, the magnetization 7 of the first anti-ferromagnetic sublayer 3 having the larger layer thickness is predominant. In a simplified illustration, the AAF reference layer system 13 has a total magnetization (a net moment) 10 that results from the vectorial addition of the magnetizations 7, 8 of the ferromagnetic sublayers 3, 5.

In the illustration, the net moment 10 of the AAF reference layer system 13 is oriented parallel to the magnetization 6 of the memory layer 1. In the case of the simplifying magnetostatic consideration, respective magnetizations of the same sense which lie opposite one another at the tunnel barrier 2 and counteract the parallel orientation of the magnetization 6 of the memory layer 1 with respect to the magnetization 7 of the reference layer 3 form in this case at vertical boundaries of the memory layer 1 and of the AAF reference layer system 13 with respect to the tunnel barrier 2.

Figure 4B:
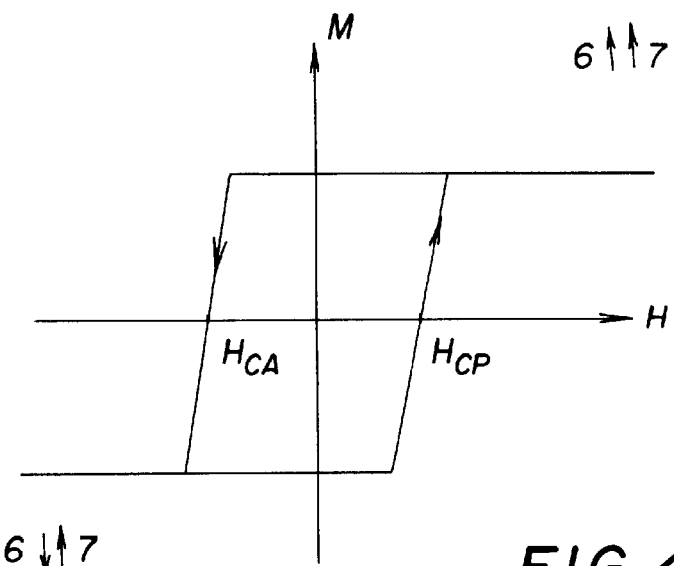
FIG. 4B is a simplified illustration of the magnetization curve of the memory layer of the magnetoresistive memory cell.

Thus, in the case of a magnetoresistive memory cell with an asymmetrical AAF layer system, the leakage field of the net moment 10 counteracts the Néel interaction if the first ferromagnetic sublayer 3 oriented toward the tunnel barrier 2 has a larger layer thickness than the second ferromagnetic sublayer 5. As illustrated in FIG. 4B, the leakage field coupling shifts the magnetization curve toward the right, counter to the effect of the Néel interaction. The magnetization curve of the memory layer 1 and thus the switching behavior of the memory cell can be symmetrical through suitable dimensioning of the AAF reference layer system 13.

Such a construction has two disadvantages. First, the roughness of the ferromagnetic layers on both sides of the separating layer and thus the magnitude of the Néel interaction cannot be unambiguously controlled according to the present-day state of the production technologies.

Second, for instance, the dynamic properties of a magnetoresistive memory cell based on such a configuration deteriorate in the case of relatively strong magnetic interactions between the AAF reference layer system and the memory layer. In a simplified illustration, strongly coupled systems react more sluggishly than weakly coupled systems, independently of the degree of compensation of the interactions in the memory layer.

It is attempted, therefore, to provide an AAF reference layer system with a net moment that is directed oppositely to an orientation of a magnetization in a first ferromagnetic sublayer, oriented toward a separating layer, of the AAF layer system. In such an AAF reference layer system, a leakage field assigned to the net moment also acts at the surface, oriented toward the separating layer, of the first ferromagnetic sublayer, oriented toward the separating layer, of the AAF layer system. A magnetization of bulges of this surface by the magnetization of the first ferromagnetic sublayer is at least partly compensated for by the net moment. The magnitude of the Néel interaction acting between the two ferromagnetic layers on both sides of the separating layer is thereby reduced.

In a known configuration, such a net moment is produced by an inverse asymmetrical artificial antiferromagnet (herein-after also "inverse AAF layer system"). In such an inverse AAF layer system, the first ferromagnetic sublayer oriented toward the separating layer has a smaller layer thickness than the second ferromagnetic sublayer remote from the separating layer. Given identical materials for the two ferromagnetic sublayers of the AAF layer system, or in the event of the two ferromagnetic sublayers having a magnetization of identical magnitude, a net moment results which is always opposite to the magnetization of the first ferromagnetic sublayer oriented toward the separating layer.

As shown, the net moment of such an inverse asymmetrical AAF layer system admittedly reduces the magnitude of the Néel interaction between the first ferromagnetic sublayer of the AAF layer system and a second ferromagnetic layer lying opposite the AAF layer system at the separating layer.

What is disadvantageous about the configuration, however, is that the net moment acts, with regard to an orientation of the magnetization of the second ferromagnetic layer, in the same direction as the remaining Néel interaction. Thus, like the latter, the net moment supports a parallel orientation of the two magnetizations of the two ferromagnetic layers on both sides of the separating layer. The magnetization behavior of the ferromagnetic layer of such a system and thus the switching behavior for instance of a magnetoresistive memory cell based on such a configuration is asymmetrical.

Figure 5A:
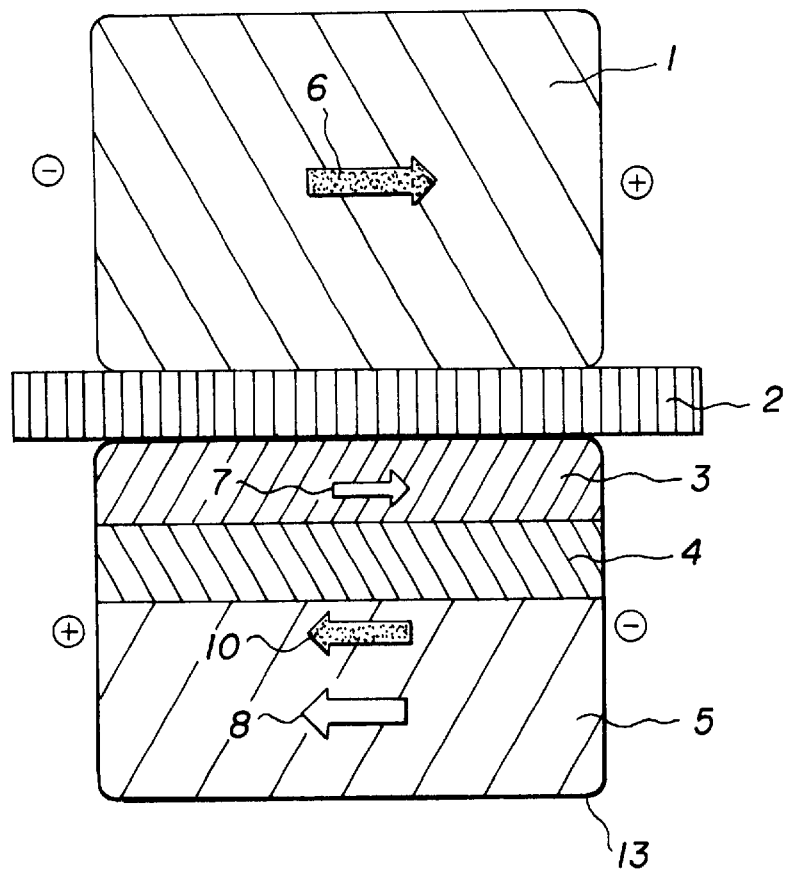
FIG. 5A is a diagrammatic, cross-sectional view through a magnetoresistive memory cell with an inverse asymmetrical AAF reference layer system according to the invention.

FIG. 5A shows a simplified cross-sectional view, which is not true to scale and is restricted to the illustration of the features essential to the invention, through a magnetoresistive memory cell with the inversely asymmetrical AAF reference layer system 13, and the magnetization curve of the memory layer 1 of the magnetoresistive memory cell, according to the invention.

The memory layer 1 with the magnetization 6 and the AAF reference layer system 13 lie opposite one another with regard to the tunnel barrier 2. The first ferromagnetic sublayer 3 of the AAF layer system 13 carries a magnetization 7 and is oriented toward the tunnel barrier 2, and the second ferromagnetic sublayer 5 carries a magnetization 8 directed oppositely to the magnetization 7. The two ferromagnetic sublayers 3, 5 of the AAF reference layer system 13 are separated from one another by a conductive spacer layer (spacer) 4, via which the anti-ferromagnetic coupling of the two ferromagnetic sublayers 3, 5 is effected by the Rudermann-Kittel-Kasuya-Yosida interaction.

By virtue of the larger layer thickness of the second ferromagnetic sublayer (reference coupling layer) 5 of the AAF reference layer system 13, a net moment 10 of the AAF reference layer system 13 is produced in the case of a simplified consideration in the vectorial addition of the two magnetizations 7, 8 of the two ferromagnetic sublayers 3, 5. The net moment 10 is directed oppositely to the magnetization 7 of the first ferromagnetic sublayer 3 oriented toward the tunnel barrier 2 and reduces the Néel interaction thereof with the memory layer 1. In the case of a magnetostatic consideration, the leakage field of the net moment 10 outside the AAF reference layer system 13 supports a parallel orientation of the magnetizations 6 and 7, that is to say acts in the same direction as the remaining Néel interaction.

Figure 5B:
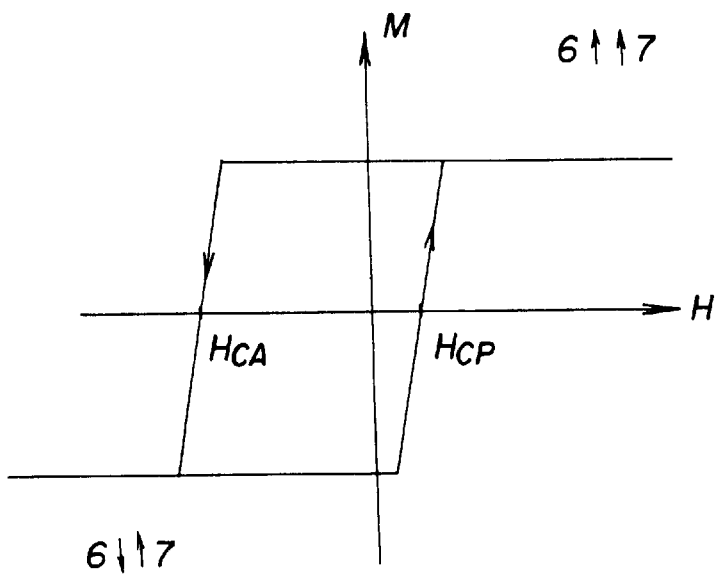
FIG. 5B is a simplified illustration of the magnetization curve of the memory layer of the magnetoresistive memory cell.

FIG. 5B shows the magnetization curve for the memory layer 1 of the configuration illustrated in FIG. 5A. In this case, the magnetization 6 of the memory layer 1 parallel to the magnetization 7 of the ferromagnetic sublayer 3 oriented toward the tunnel barrier 2 is defined as positive. Néel interaction and leakage field interaction shift the magnetization curve toward the left along the abscissa axis. A changeover of the magnetization 6 into a state parallel to the magnetization 7 is supported by the two couplings, so that a reduced field strength $H_{CP}$ relative to the configuration in FIG. 4B is required for this operation.

In contrast, a changeover from the parallel state of the two magnetizations 6, 7 into an anti-parallel state requires a field strength HCA of increased magnitude relative to that in the configuration in FIG. 4B, since the Néel interaction and the leakage field interaction are an obstacle to the magnetization reversal process.

Figure 1A:
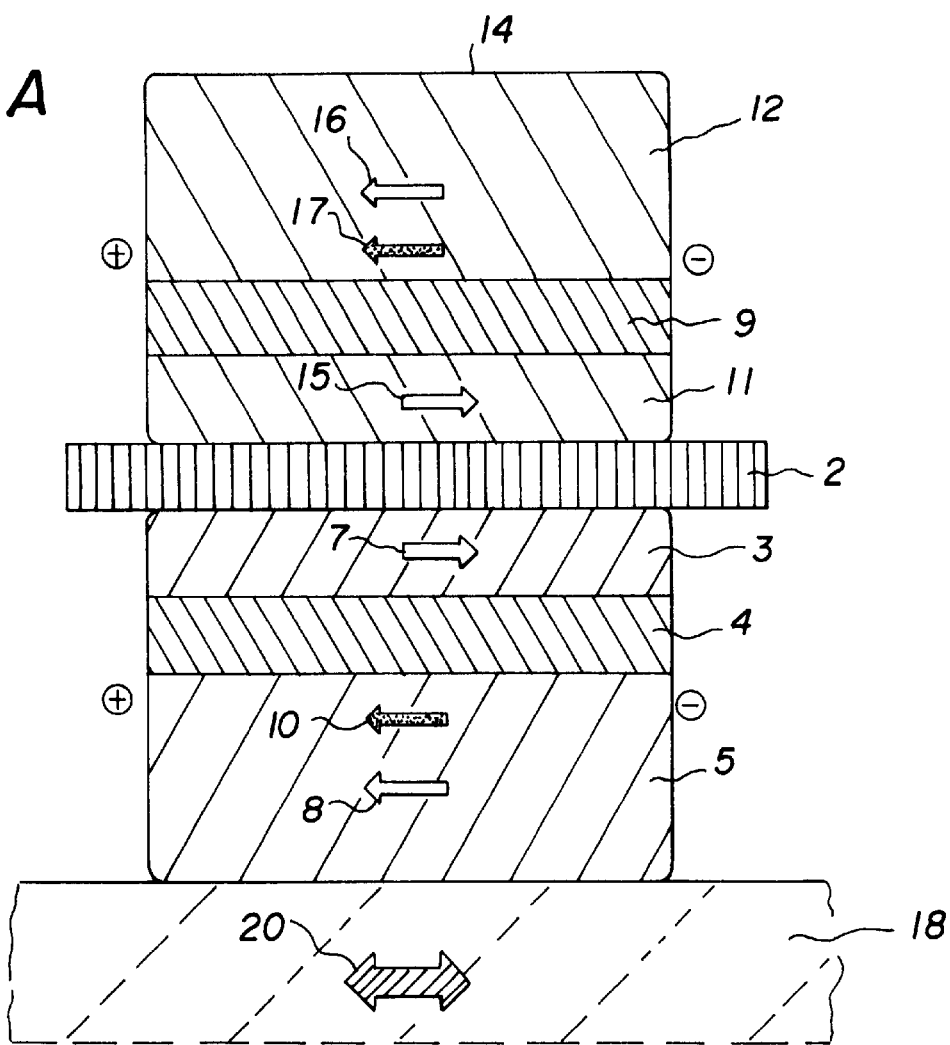
FIG. 1A is a diagrammatic, cross-sectional view of a configuration according to the invention.

FIG. 1A shows a simplified cross section—which is not true to scale and is restricted to the illustration of the features essential to the invention—through a magnetoresistive memory cell in a particularly preferred embodiment of the invention.

In this case, the AAF reference layer system 13 and an AAF memory layer system 14 are disposed on both sides of the tunnel barrier 2. The AAF reference layer system 13 is constructed as an inversely asymmetrical AAF layer system 13, in which the ferromagnetic sublayer 3, 5 is in each case disposed on both sides of the spacer layer 4. In this case, the first ferromagnetic sublayer 3 oriented toward the tunnel barrier 2 has the magnetization 7 and the second ferromagnetic sublayer 5 has the magnetization 8 directed oppositely to the magnetization 7. As a result of the smaller layer thickness of the ferromagnetic sublayer 3, the magnetization 8 of the second ferromagnetic sublayer 5 is predominant in the AAF reference layer system 13. There results approximately the net moment 10 of the AAF reference layer system 13 that results from the vectorial addition of the magnetizations 7 and 8.

In the same way, the AAF memory layer system 14 is constructed as an inversely asymmetrical AAF layer system 14. Two ferromagnetic sublayers 11, 12 of the AAF memory layer system 14 are situated on both sides of a second spacer layer 9. Magnetizations 15, 16 of the two sublayers 11, 12 of the AAF memory layer system 14 are directed oppositely to one another. As a result of the smaller layer thickness of the first sublayer 11 oriented toward the tunnel barrier 2, there results a net moment 17 of the AAF memory layer system 14 which is directed oppositely to the magnetization 15 of the first sublayer 11 oriented toward the tunnel barrier 2.

In the case of a parallel orientation of the two ferromagnetic sublayers 3, 11, oriented toward the tunnel barrier 2, of the two layer systems 13, 14, the net moments 10, 17 of the two layer system 13, 14 are also oriented parallel to one another.

In a simplified consideration of the leakage field interaction of the net moments 10, 17, magnetizations of the same sense in this case lie opposite one another at boundaries of the layer systems 13, 14 at the tunnel barrier 2. These magnetizations of the same polarity repel one another and thus promote a changeover into an oppositely directed orientation in the case of a parallel orientation of the magnetizations 7, 15.

An exchange bias layer 18 is illustrated by broken lines in FIG. 1A. It represents a further preferred embodiment of the invention.

In this case, the exchange bias layer 18 is disposed at a surface of the reference layer system 13 that lies remote from the tunnel barrier 2.

The exchange bias layer 18 is composed of a naturally anti-ferromagnetic material. If a ferromagnetic layer, that is to say, for instance, the second ferromagnetic sublayer 5 of the AAF reference layer system 13, is applied directly to such a layer, then a coupling ("exchange biasing") is established between the exchange bias layer 18 and the sublayer 5. The coupling stabilizes the magnetization 8 of the second ferromagnetic sublayer 5 of the AAF reference layer system 13.

Figure 1B:
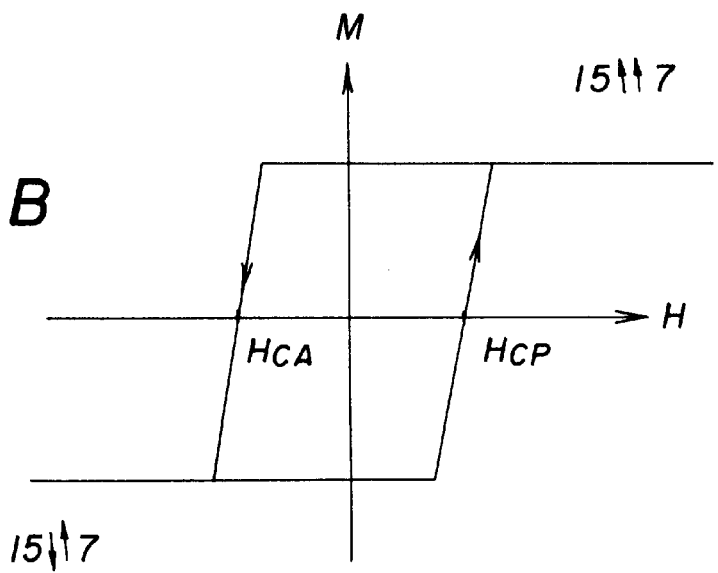
FIG. 1B is a simplified illustration of a magnetization curve.

In such configurations, the leakage field interaction is thus directed oppositely to the remaining Néel interaction. In FIG. 1B, the Néel interaction shifts the magnetization curve toward the left along the abscissa axis, while the leakage field interaction shifts the magnetization curve to positive abscissa values.

Thus, such a construction makes it possible both to reduce the magnitude of the Néel interaction between two layers on both sides of the tunnel barrier 2 and to compensate for the remaining proportion of the Néel interaction.

I claim:

1. A configuration for minimizing a Néel interaction, comprising:

a first asymmetrical artificial anti-ferromagnetic layer system having a first ferromagnetic sublayer, a second ferromagnetic sublayer, and a first spacer layer disposed between said first and second ferromagnetic sublayers;

a separating layer, said first ferromagnetic sublayer being oriented toward said separating layer and having a smaller layer thickness than said second ferromagnetic sublayer of said first asymmetrical artificial anti-ferromagnetic layer system; and a second asymmetrical artificial anti-ferromagnetic layer system having a first ferromagnetic sublayer oriented toward said separating layer, a second ferromagnetic sublayer, and a second spacer layer disposed between said first and second ferromagnetic sublayers of said second asymmetrical artificial anti-ferrromagnetic layer system, said first ferromagnetic sublayer of said second asymmetrical artificial anti-ferromagnetic layer system having a smaller layer thickness than said second ferromagnetic sublayer of said second asymmetrical artificial anti-ferromagnetic layer system, and resulting total magnetizations of said first and second asymmetrical artificial anti-ferromagnetic layer systems being accumulated vectorially in a manner that compensates for the Néel interaction between said first ferromagnetic sublayer of said first asymmetrical artificial anti-ferromagnetic layer system and said first ferromagnetic sublayer of said second asymmetrical artificial anti-ferromagnetic layer system each being oriented toward said separating layer.

2. The configuration according to claim 1, wherein said first symmetrical artificial anti-ferromagnetic layer system is a reference layer system and said second asymmetrical artificial anti-ferromagnetic layer system is a memory layer system of a magneto-resistive memory cell.

3. The configuration according to claim 2, wherein said magneto-resistive memory cell is based on a tunnel effect and said separating layer is composed of a dielectric material and functioning as a tunnel barrier.

4. The configuration according to claim 3, further comprising at least one exchange bias layer disposed at a surface of said reference layer system lying remote from said tunnel barrier and a magnetization of said exchange bias layer is fixedly coupled to a magnetization of said reference layer system.

5. The configuration according to claim 4, wherein said exchange bias layer extends beyond dimensions of said reference layer system in a plane parallel to said tunnel barrier.

* * * * *